US012796510B2

(12) United States Patent
Bruns et al.

(10) Patent No.: US 12,796,510 B2
(45) Date of Patent: Nov. 10, 2026

(54) POWER MODULE

(71) Applicant: Robert Bosch GmbH, Stuttgart (DE)

(72) Inventors: Gunnar Bruns, Neumuenster (DE); Irfan Aydogmus, Nuertingen (DE); Marco Salvatore Costa, Weil Im Schoenbuch (DE); Sebastian Strache, Wannweil (DE)

(73) Assignee: ROBERT BOSCH GMBH, Stuttgart (DE)

( * ) Notice: Subject to any disclaimer, the term of this patent is extended or adjusted under 35 U.S.C. 154(b) by 345 days.

(21) Appl. No.: 18/534,894

(22) Filed: Dec. 11, 2023

(65) Prior Publication Data

US 2024/0203863 A1 Jun. 20, 2024

(30) Foreign Application Priority Data

Dec. 14, 2022 (DE) ..................... 10 2022 213 629.2

(51) Int. Cl.
*H10W 70/65* (2026.01)
*H10W 40/00* (2026.01)
(Continued)

(52) U.S. Cl.
CPC ......... *H10W 70/658* (2026.01); *H10W 90/00* (2026.01); *H10W 90/401* (2026.01);
(Continued)

(58) Field of Classification Search
CPC . H10W 40/00; H10W 40/255; H10W 70/658; H10W 72/50; H10W 72/5445;
(Continued)

(56) References Cited

U.S. PATENT DOCUMENTS 6,060,772 A 5/2000 Sugawara et al.
8,228,113 B2 * 7/2012 Domes ................ H03K 17/567
327/437

(Continued)

FOREIGN PATENT DOCUMENTS

DE 10316355 B3 7/2004
DE 10355925 A1 6/2005

(Continued)

*Primary Examiner* — Telly D Green
(74) *Attorney, Agent, or Firm* — NORTON ROSE FULBRIGHT US LLP

(57) ABSTRACT

A power module. The power module includes a first circuit carrier and at least one second circuit carrier. The first circuit carrier has power conductor structures on a first side which form a first power level in which external contact regions are arranged. The second circuit carrier is arranged spatially in parallel with the first circuit carrier and has at least one further power conductor structure on a first side facing the first side of the first circuit carrier, which forms a second power level. The further power conductor structure is electrically connected at an internal contact region to an internal contact region of one of the power conductor structures of the first circuit carrier. A control signal conductor structure is arranged on the electrically insulating layer on a second side of the second circuit carrier, and forms a signal level.

12 Claims, 6 Drawing Sheets

(51) Int. Cl.
*H10W 90/00* (2026.01)
*H10W 72/50* (2026.01)

(52) U.S. Cl.
CPC .......... *H10W 90/701* (2026.01); *H10W 40/00* (2026.01); *H10W 72/5445* (2026.01); *H10W 90/754* (2026.01)

(58) Field of Classification Search
CPC . H10W 90/00; H10W 90/401; H10W 90/701; H10W 90/754
See application file for complete search history.

(56) References Cited

U.S. PATENT DOCUMENTS

| | | | | |
|---|---|---|---|---|
| 8,410,591 | B2 * | 4/2013 | Otremba | H10W 70/481 257/784 |
| 2007/0216011 | A1 * | 9/2007 | Otremba | H10W 90/811 257/E23.044 |
| 2008/0224323 | A1 * | 9/2008 | Otremba | H10W 70/481 257/E23.141 |
| 2011/0102054 | A1 * | 5/2011 | Domes | H03K 17/567 327/419 |
| 2012/0307541 | A1 | 12/2012 | Shimoike et al. | |
| 2024/0203862 | A1 * | 6/2024 | Bruns | H10W 70/658 |
| 2024/0203863 | A1 * | 6/2024 | Bruns | H10W 70/658 |

FOREIGN PATENT DOCUMENTS

| | | | | | |
|---|---|---|---|---|---|
| DE | 102004025609 | A1 | | 12/2005 | |
| DE | 102008036112 | A1 | | 2/2009 | |
| DE | 102009002993 | B4 | * | 10/2012 | H05K 7/209 |
| DE | 112013001234 | T5 | | 1/2015 | |
| DE | 102014219998 | A1 | | 4/2016 | |
| EP | 2557595 | A1 | * | 2/2013 | H01L 25/162 |
| EP | 3236498 | A1 | * | 10/2017 | H01L 24/49 |
| JP | 2012064677 | A | | 3/2012 | |
| WO | WO-2022128999 | A1 | * | 6/2022 | H01L 23/5386 |
| WO | WO-2022184640 | A1 | * | 9/2022 | H05K 1/0228 |

* cited by examiner

POWER MODULE

FIELD

The present invention relates to a power module, in particular for providing a phase current for an electric motor of a vehicle.

BACKGROUND INFORMATION

German Patent Application No. DE 10 2014 219 998 B4 describes a power module for providing a phase current for an electric motor. The power module comprises a circuit carrier having a surface, at least two first contact faces on the surface, and at least two first power transistors, which each have a ground contact face. In each case, a first power transistor of the at least two first power transistors is arranged directly on one of the first contact faces and is electrically conductively connected directly to the corresponding first contact face via its ground contact face. In addition, the power module comprises a second contact face on the surface and at least two second power transistors, which each have a ground contact face. The at least two second power transistors are arranged directly on the second contact face and are electrically conductively connected directly to the second contact face via their respective ground contact faces. Furthermore, the power module comprises at least two third contact faces on the surface, wherein the at least two second power transistors each have a further contact face on the sides thereof remote from the surface of the circuit carrier, and in each case a second power transistor of the at least two second power transistors is electrically conductively connected to one of the at least two third contact faces via the further contact face thereof and corresponding bond connections. The at least two first contact faces and the at least two third contact faces are arranged alternately one after the other in a longitudinal direction of the power module, and the second contact face is arranged next to the at least two first contact faces and the at least two third contact faces, wherein the second contact face has at least two contact regions, wherein in each case one of the at least two contact regions is located next to one of the at least two first power transistors. The at least two first power transistors each have a further contact face on the sides thereof remote from the surface of the circuit carrier, and in each case a first power transistor of the at least two first power transistors is electrically conductively connected via the further contact face thereof and corresponding bond connections to the one contact region of the at least two contact regions of the second contact face located next to said power transistor. In this case, the at least two contact regions of the second contact face and the at least two second power transistors are arranged alternately one after the other in the longitudinal direction.

SUMMARY

A power module having features of the present invention may have an advantage that, on a first circuit carrier, a plurality of power conductor structures are arranged on a first side for current conduction and on at least one second circuit carrier, which is arranged spatially in parallel with the first circuit carrier, at least one power conductor structure is arranged on a first side facing the first current carrier for current conduction and at least one control signal line structure is arranged on a second side for signal conduction, so that a two-sided use of the at least one second circuit carrier is possible. In addition, this arrangement of the circuit carriers makes it possible to divide the conduction of the control signals and the conduction of the currents, which provide an output power, into different levels. In this case, a signal level is formed on the second side, preferably an upper side, of the at least one second circuit carrier. A first power level is formed on the first side, preferably the upper side of the first circuit carrier, and a second power level is formed on the second side, preferably on the underside of the at least one second circuit carrier.

Example embodiments of the present invention provide a power module comprising a first circuit carrier and at least one second circuit carrier. On a first side, the first circuit carrier has a plurality of power conductor structures arranged on an electrically insulating layer, which power conductor structures form a first power level in which external contact regions of the power conductor structures are arranged. The at least one second circuit carrier is arranged spatially in parallel with the first circuit carrier and has at least one further power conductor structure arranged on an electrically insulating layer on a first side facing the first side of the first circuit carrier, which further power conductor structure forms a second power level. The at least one further power conductor structure of the at least one second circuit carrier is electrically connected at an internal contact region to an internal contact region of one of the power conductor structures of the first circuit carrier. At least one control signal conductor structure is arranged on the electrically insulating layer on a second side of the at least one second circuit carrier, and forms a signal level. In this case, at least two semiconductor switches are arranged and electrically contacted with the power connections thereof between another of the conductor structures of the first power level of the first circuit carrier and the at least one power conductor structure of the second power level of the at least one second circuit carrier, with control connections of the at least two semiconductor switches being electrically connected to the at least one control signal conductor structure of the at least one second circuit carrier.

According to an example embodiment of the present invention, the first circuit carrier and/or the at least one second circuit carrier can be designed, for example, as an AMB substrate (AMB: active metal braze) or as a DBC substrate (DBC: direct bonded copper). The first circuit carrier can preferably be designed as an AMB substrate and the at least one second circuit carrier can be designed as a DBC substrate. The semiconductor switches can preferably be designed as field-effect transistors, so that drain connections of the semiconductor switches can each correspond to a first power connection and source connections of the semiconductor switches can each correspond to a second power connection. A control connection can, for example, be a gate connection or a Kelvin source connection of a field-effect transistor.

The measures and further developments disclosed herein allow advantageous improvements to be made to the power module according to the present invention.

According to an example embodiment of the present invention, it is particularly advantageous that, on a second side, the first circuit carrier can have at least one thermal interface, which can be contacted with a cooling device. Thus, a heat sink, a water cooler, or another suitable cooling element can be connected to the first circuit carrier via the thermal interface on the second side, preferably on an underside, of the first circuit carrier. The thermally highly conductive contacting can be produced, for example, via a solder connection or an adhesive connection with a conductive adhesive.

In an advantageous embodiment of the power module of the present invention, an encasement can completely enclose the power module with the at least one thermal interface being left exposed. In this case, the encasement can have at least one recess respectively in the region of external contact regions of the first circuit carrier and in the region of external contact regions of the at least one second circuit carrier. Due to the encasement, which can preferably be formed by a cured mold compound, the service life of the semiconductor switches and the electrical connections and contacts can be significantly increased, since the encasement ensures good fixing of the semiconductor switches and of the at least one second circuit carrier even at high temperatures. In addition, the semiconductor switches and the different electrical contacts and connections and the conductor structures are protected from external influences by the encasement. Furthermore, the enclosure allows easier handling of the enclosed power module, so that the power modules can easily be further processed and transported.

In a further advantageous embodiment of the power module of the present invention, a common conductor structure can be arranged on the electrically insulating layer as part of the signal level on the second side of the at least one second circuit carrier. Additionally, control connections of the at least two semiconductor switches designed as Kelvin source connections can be electrically connected to the common conductor structure. In this case, the at least one second circuit carrier can be placed in such a way that a first electrically symmetrical current star point of the signal level, which corresponds to a geometric center of the common conductor structure, overlaps at least partially with a spacer element which forms a second electrically symmetrical current star point of the first and second power levels and electrically connects the internal contact region of the at least one further power conductor structure of the at least one second circuit carrier to the internal contact region of one of the power conductor structures of the first circuit carrier. As a result of the symmetrical current star points of the signal level and the power levels arranged one above the other, magnetic coupling between the power levels and the signal level and symmetrical control of the power semiconductors can be achieved. Due to the magnetic coupling, Kelvin source currents can be generated in the switching torques, which currents counteract control currents and control voltages at the control connections of the corresponding semiconductor switches when a corresponding control charge is built up, whereby the switched load current can be reduced in particular in the event of a short circuit. In addition, the central position of the current star points results in symmetrical connections of the semiconductor switches and consequently symmetrical, particularly short and low-impedance current paths.

In a further advantageous embodiment of the power module of the present invention, at least one measuring signal conductor structure can be arranged on the electrically insulating layer as part of the signal level on the second side of the at least one second circuit carrier. In this case, an internal contact region of a first measuring signal conductor structure of the at least one second circuit carrier can be electrically connected to one of the power conductor structures of the first circuit carrier via a connection line which can preferably be designed as a bonding wire. An external contact region of the first measurement signal structure of the at least one second circuit carrier can provide a power measurement point via a spacer element. As a result, the measuring pickup of a voltage applied to the corresponding power conductor structure can also take place on the signal level.

In a further advantageous embodiment of the power module of the present invention, an internal contact region of a second measuring signal conductor structure of the at least one second circuit carrier can be electrically connected to a first connection of a temperature sensor, the second connection of which is electrically connected to an internal contact region of the common conductor structure of the at least one second circuit carrier. In this case, an external contact region of the second measurement signal structure can provide a temperature measurement signal. The temperature tap can thereby also take place on the signal level. Since the signal level is arranged directly above and closer to the semiconductor chips of the semiconductor switches, the temperature thereof can be measured better.

In a further advantageous embodiment of the power module of the present invention, at least one first conductor structure of the first circuit carrier can be contacted via at least one external contact region with a positive supply connection. At least one second conductor structure of the first circuit carrier can be contacted via at least one external contact region with a negative supply connection. At least one third conductor structure of the first circuit carrier can be contacted via at least one external contact region with a load connection. In this case, at least two first semiconductor switches can each form a “high-side switch” of the power module and be arranged and electrically contacted with the power connections thereof between the at least one first conductor structure of the first circuit carrier and the at least one further power conductor structure of a first second circuit carrier. Control connections of the high-side switches designed as gate connections can each be electrically connected to a control signal conductor structure of a second circuit carrier. The at least one further power conductor structure of the second circuit carrier can be electrically connected at the internal contact region to the internal contact region of the third power conductor structure of the first circuit carrier. This means that the at least two “high-side switches” can be electrically looped in between the positive supply connection and the load connection of the power module. In addition, at least two second semiconductor switches can each form a “low-side switch” of the power module and be arranged and electrically contacted with the power connections thereof between the at least one second conductor structure of the first circuit carrier and the at least one further power conductor structure of a further second circuit carrier. Control connections of the low-side switches designed as gate connections can each be electrically connected to a control signal conductor structure of the further second circuit carrier. The at least one further power conductor structure of the further second circuit carrier can be electrically connected at the internal contact region to the internal contact region of the second power conductor structure of the first circuit carrier. This means that the at least two “low-side switches” can be electrically looped in between the load connection and the negative supply connection of the power module.

One exemplary embodiment of the present invention is illustrated in the figures and explained in more detail in the following description. In the figures, identical reference signs denote components or elements which perform the same or analogous functions.

DETAILED DESCRIPTION OF EXAMPLE EMBODIMENTS

Figure 1:
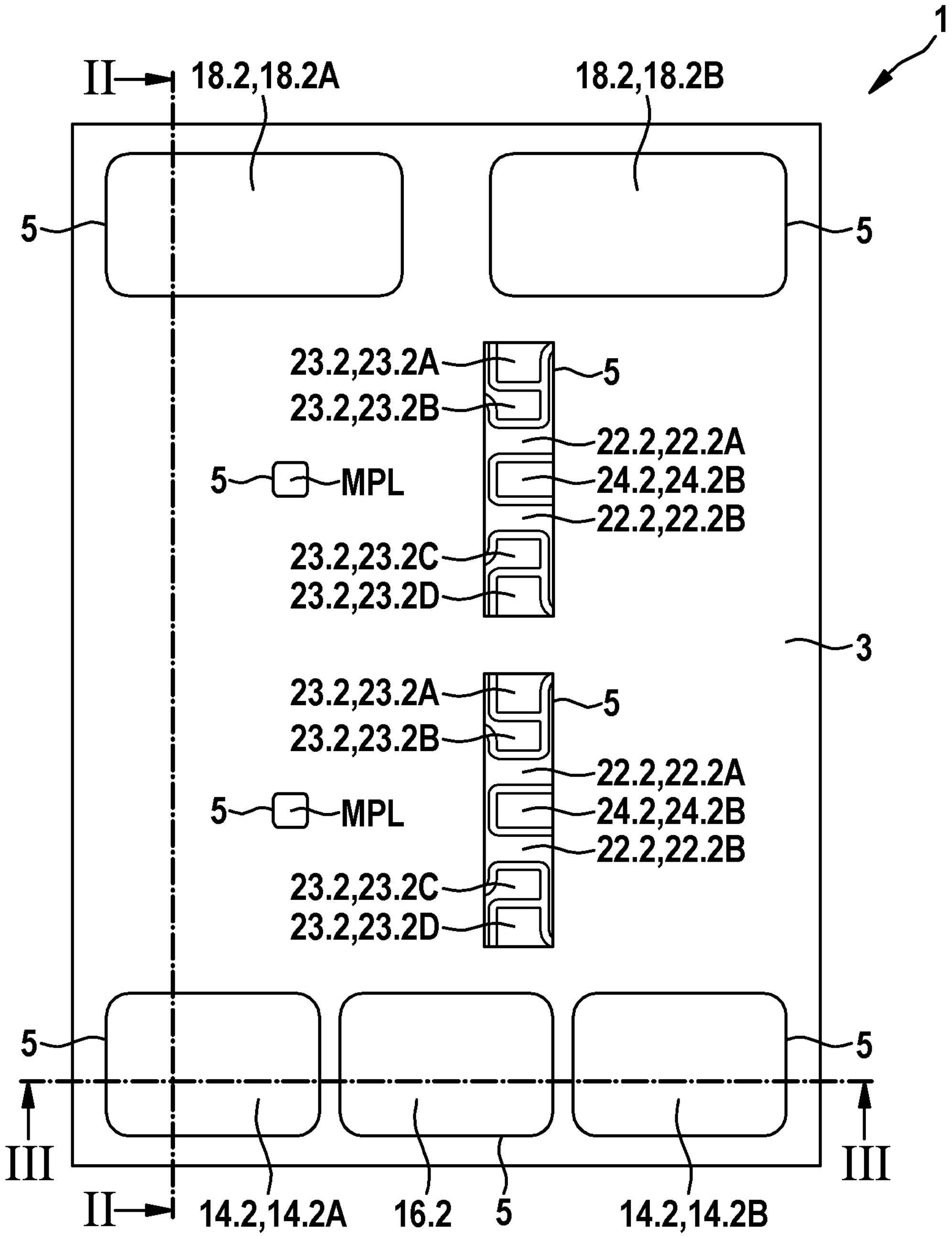
FIG. 1 is a schematic top view of an exemplary embodiment of a power module according to the present invention with an encasement.

As can be seen from FIGS. 1 to 6, the illustrated exemplary embodiment of a power module 1 according to the present invention comprises a first circuit carrier 10 and at least one second circuit carrier 20. On a first side, in this case its upper side, the first circuit carrier 10 has a plurality of power conductor structures 14, 16, 18 arranged on an electrically insulating layer 12, which power conductor structures form a first power level LS1 in which external contact regions 14.2, 16.2, 18.2 of the power conductor structures 14, 16, 18 are arranged. The at least one second circuit carrier 20 is arranged spatially in parallel with the first circuit carrier 10 and has, on a first side facing the first side of the first circuit carrier 10, in this case its underside, at least one further power conductor structure 21 arranged on an electrically insulating layer 20.1, which further power conductor structure forms a second power level LE2. The at least one further power conductor structure 21 of the at least one second circuit carrier 20 is electrically connected at an internal contact region 21.1 to an internal contact region 16.1, 18.1 of one of the power conductor structures 14, 16, 18 of the first circuit carrier 10. On a second side, in this case the upper side thereof, of the at least one second circuit carrier 20, at least one control signal conductor structure 23 is arranged on the electrically insulating layer 20.1, and forms a signal level SE. In this case, at least two semiconductor switches 30 are arranged and electrically contacted with the power connections 32, 34 thereof between another of the conductor structures 14, 16, 18 of the first power level LE1 of the first circuit carrier 10 and the at least one power conductor structure 21 of the second power level LE2 of the at least one second circuit carrier 20. Control connections 36, 38 of the at least two semiconductor switches 30 are electrically connected to the at least one control signal conductor structure 23 of the at least one second circuit carrier 20.

Figure 2:
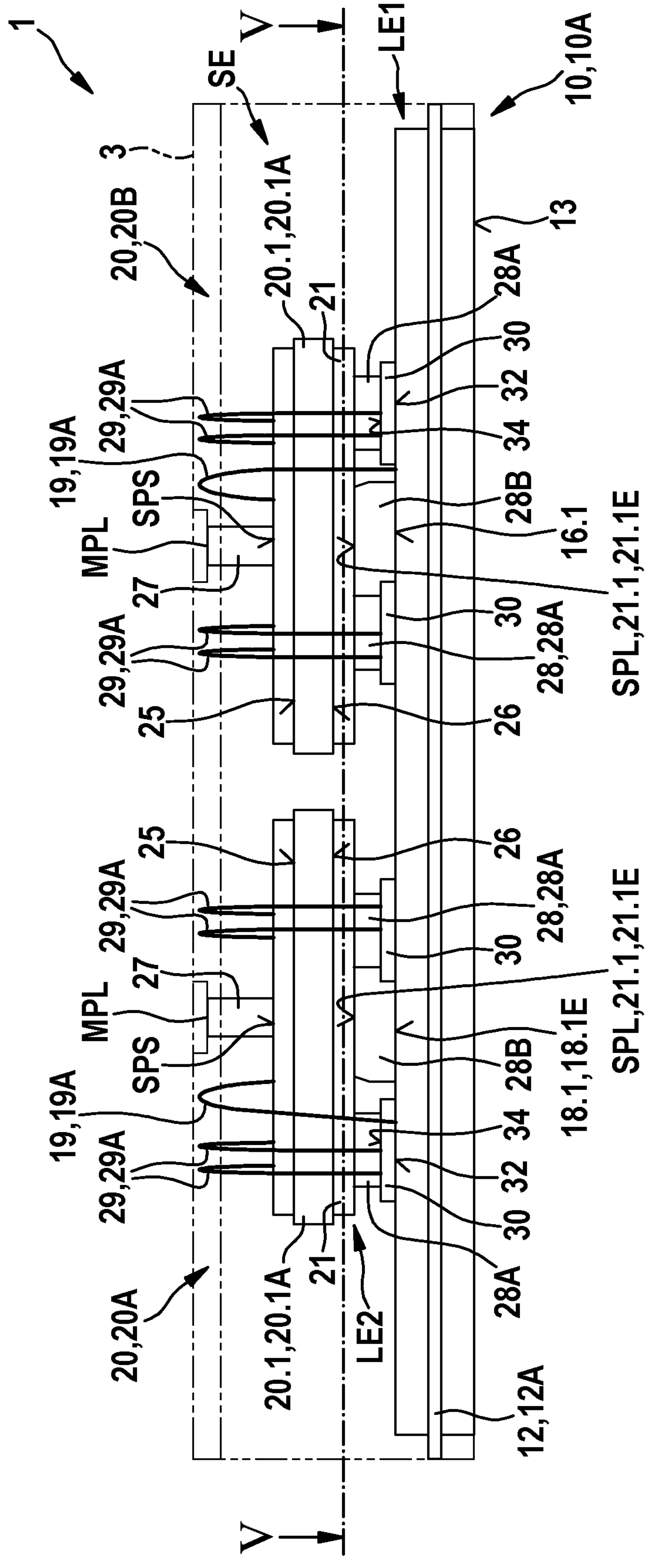
FIG. 2 is a sectional view of the power module according to the present invention from FIG. 1 along the sectional line II-II.
Figure 3:
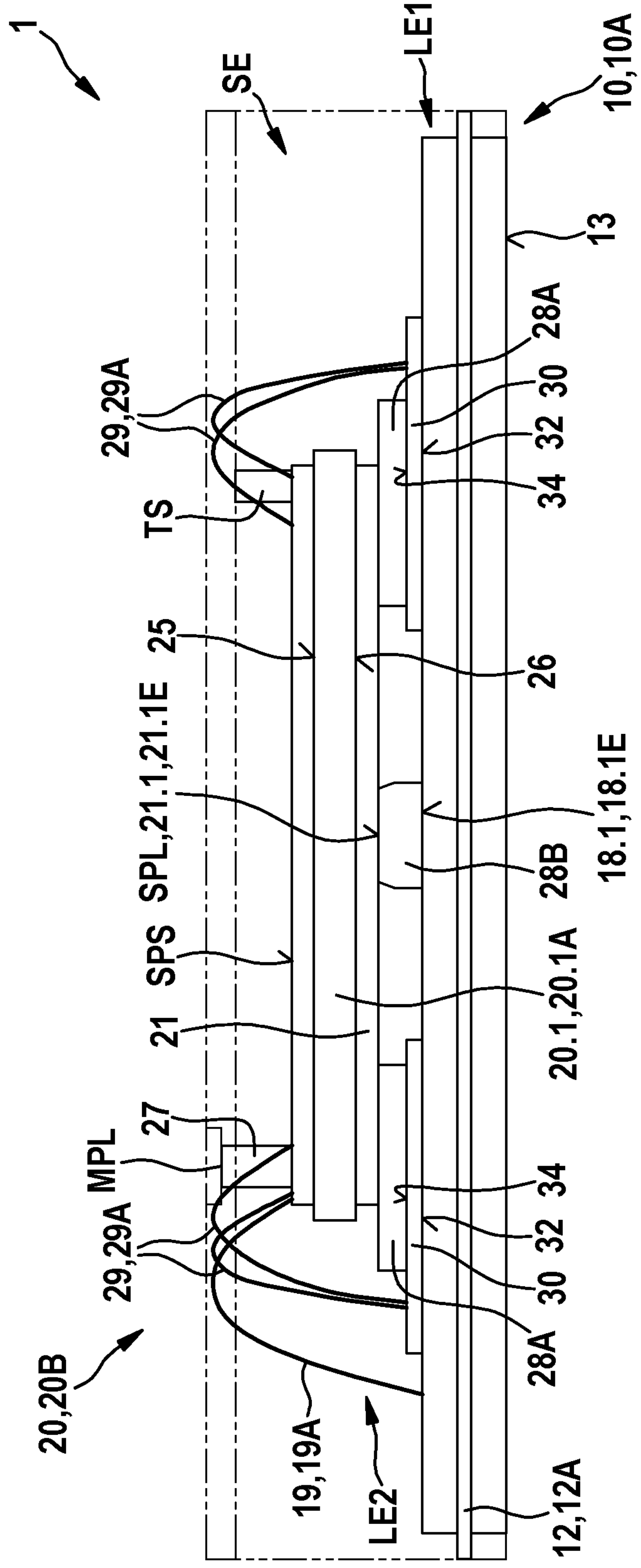
FIG. 3 is a sectional view of the power module according to the present invention from FIG. 1 along the sectional line III-III.

As can be further seen in particular from FIGS. 2 and 3, the first circuit carrier 10 has at least one thermal interface 13 on a second side, in this case its underside, which thermal interface can be contacted with a cooling device.

As can be further seen in particular from FIGS. 1 to 3, an encasement 3 completely encloses the power module 1, leaving the at least one thermal interface 13 exposed. As can be further seen from FIG. 1, the encasement 3 has at least one recess 5 in the region of external contact regions 14.2, 16.2, 18.2 of the first circuit carrier 10 and in the region of external contact regions 22.2, 23.2, 24.2 and power measurement points MPL of the at least one second circuit carrier 20.

Figure 4:
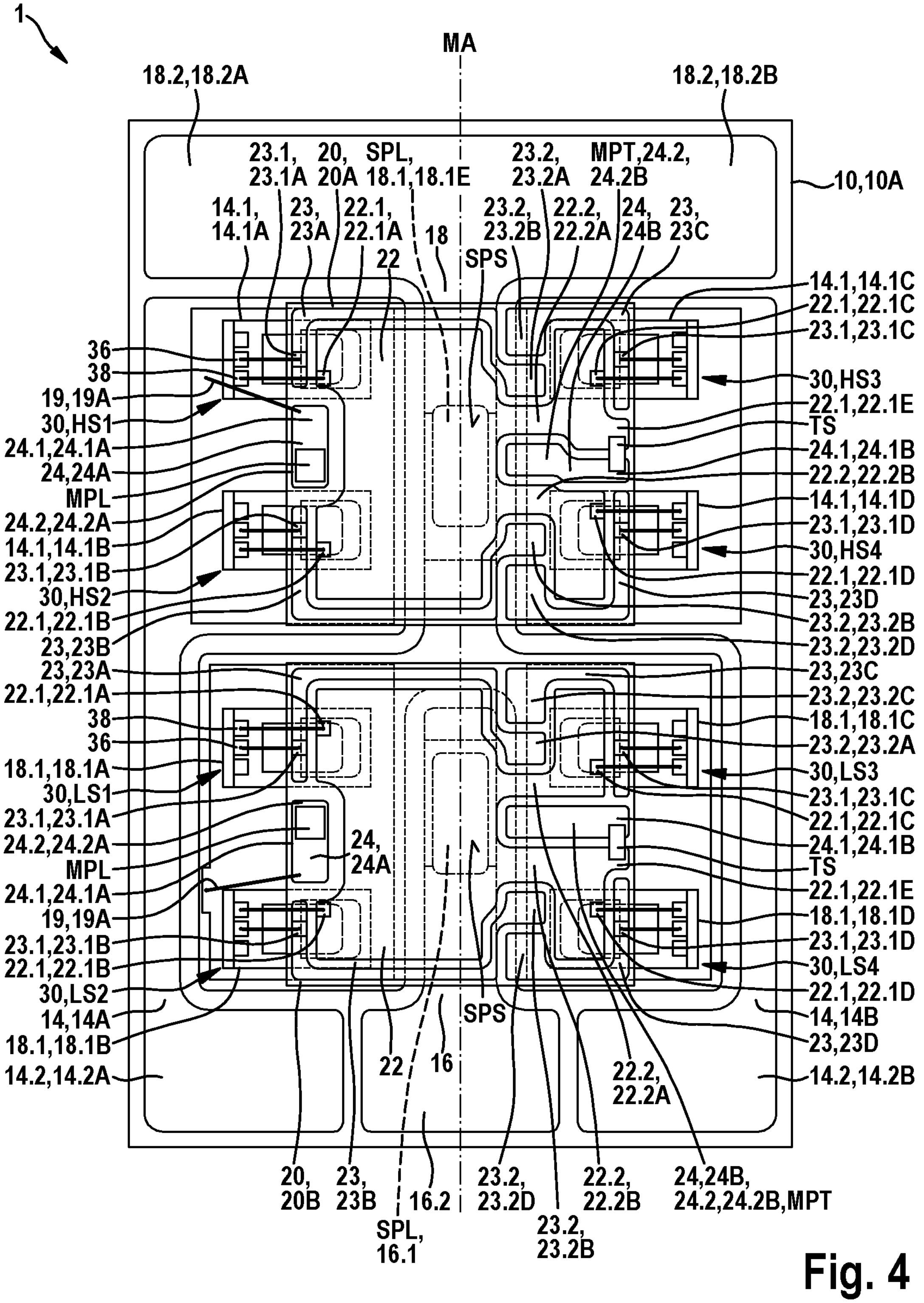
FIG. 4 is a schematic top view of the power module according to the present invention from FIG. 1 without an encasement.
Figure 5:
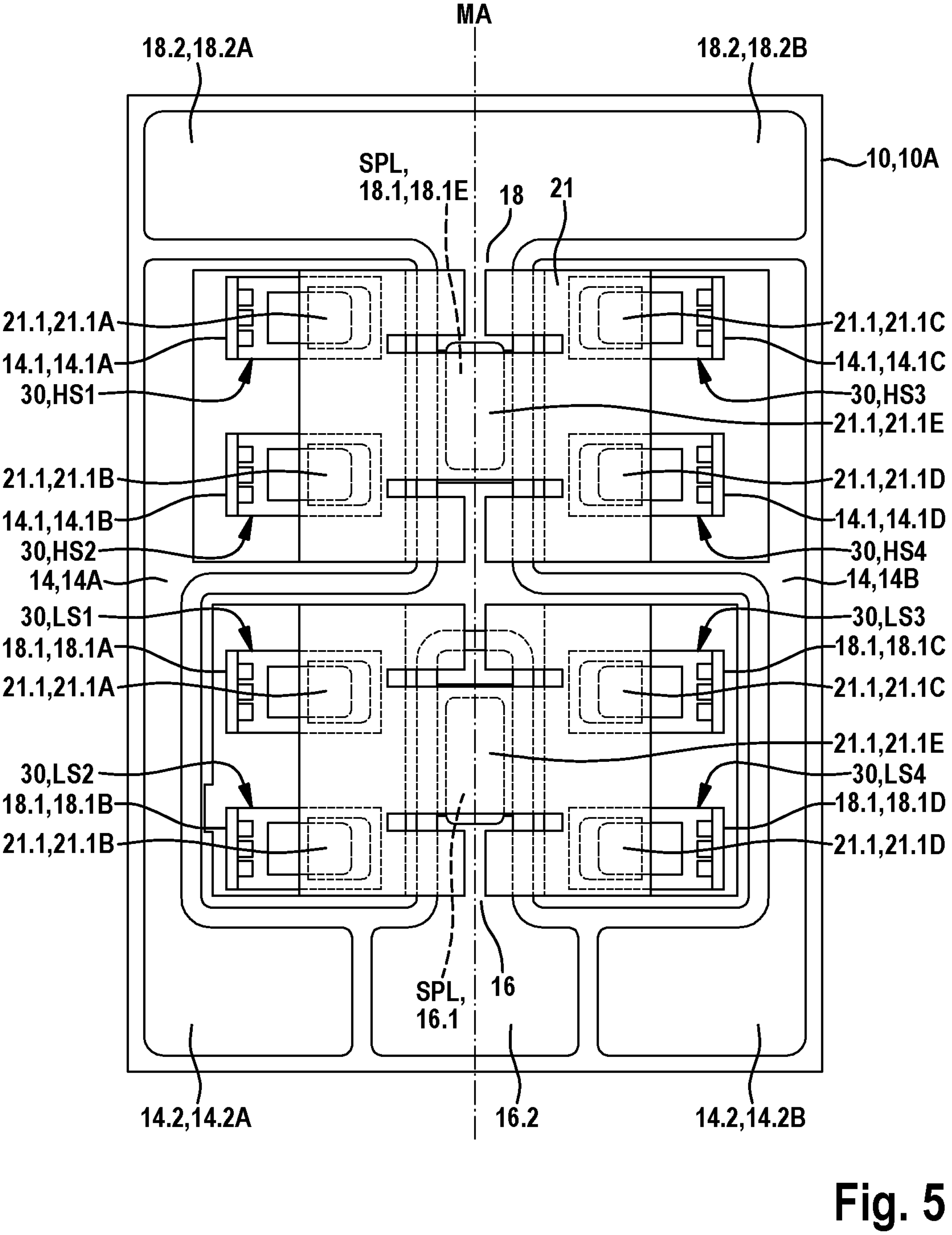
FIG. 5 is a sectional view of the power module according to the present invention from FIG. 2 along the sectional line V-V.
Figure 6:
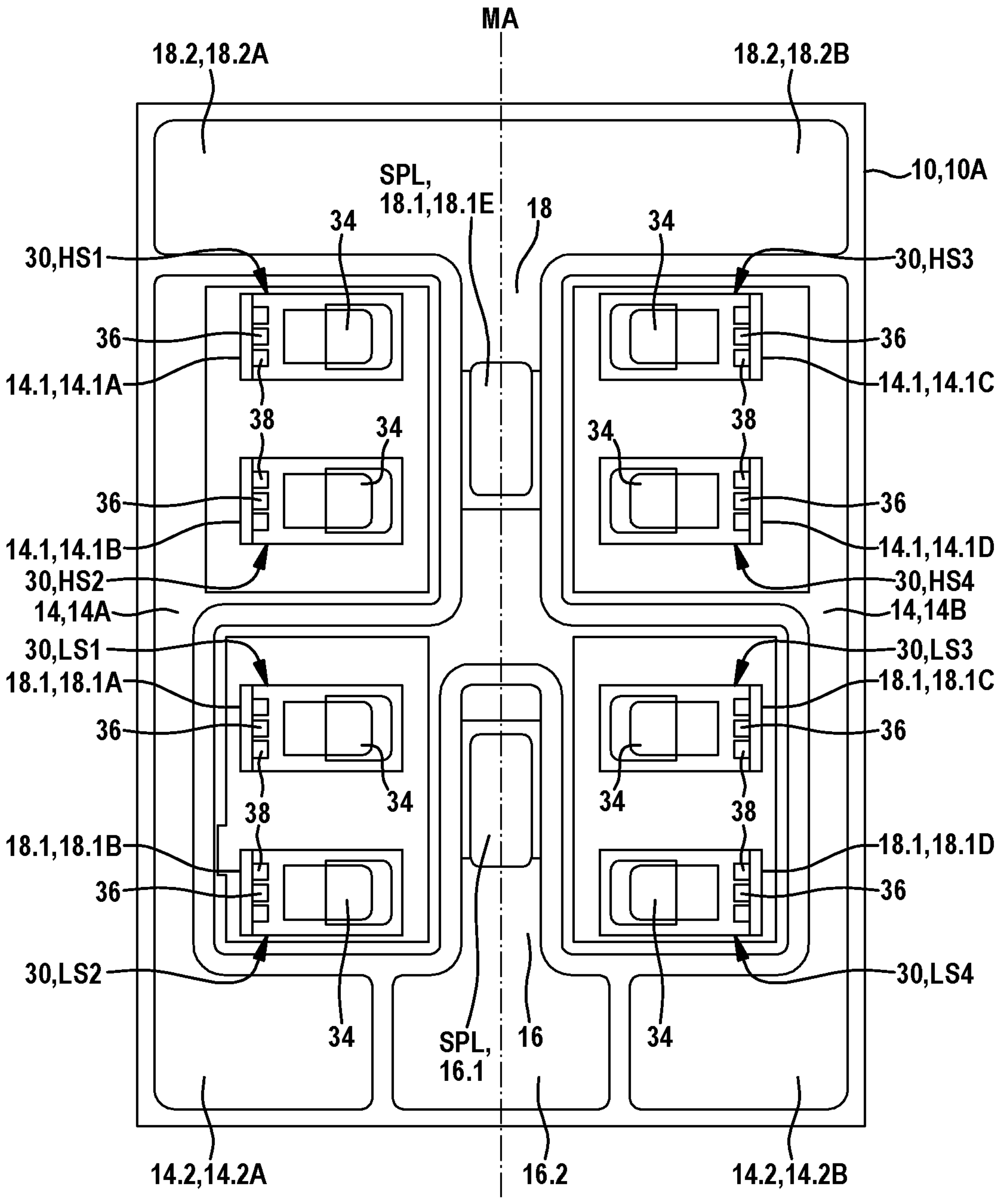
FIG. 6 is a schematic plan view of a first circuit carrier of the power module according to the present invention from FIG. 1.

As can be further seen in particular from FIGS. 4 to 6, a layout of the first circuit carrier 10 is mirror-symmetrical to a central longitudinal axis MA. For this purpose, two first power conductor structures 14A, 14B and only one second power conductor structure 16 and only one third power conductor structure 18 are formed on an upper side of the first circuit carrier 10. As can be further seen in particular from FIGS. 2 and 3, at least one metal layer is arranged on the underside of the first circuit carrier 10, which forms the at least one thermal interface 13 via which heat loss of the semiconductor switch 30 can be dissipated. In the illustrated exemplary embodiment, the first circuit carrier 10 is designed as an AMB substrate 10A (AMB: active metal brace), the at least one second circuit carrier 20 is designed as a DBC substrate (DBC: direct bonded copper) and the semiconductor switches 30 are designed as field-effect transistors, so that drain connections of the field-effect transistors each correspond to a first power connection 32 of the semiconductor switches 30 and source connections of the field-effect transistors each correspond to a second power connection 34 of the semiconductor switches 30. The control connections of the semiconductor switches 30 are designed as gate connections 36 or as Kelvin source connections 38.

As can be further seen from FIGS. 4 to 6, the two first power conductor structures 14A, 14B are each U-shaped. In this case, a first power conductor structure 14A, arranged on the left-hand side in the illustration, is rotated by 90° clockwise relative to the central longitudinal axis MA, and a first power conductor structure 14B, arranged on the right-hand side in the illustration, is rotated by 90° counterclockwise relative to the central longitudinal axis MA. In the illustrated exemplary embodiment, a first, in the illustration lower, leg of the left-hand U-shaped first power conductor structure 14A is arranged at an, in the illustration lower, edge of the first circuit carrier 10 and forms a first external contact region 14.2A of the left-hand first power conductor structure 14A. A wider second, in the illustration upper, leg of the left-hand first power conductor structure 14A forms at least one internal contact region 14.1, 14.1A, 14.1B, at which at least one of the semiconductor switches 30 is contacted. A connecting piece of the left-hand first power conductor structure 14A, which connects the two legs of the left-hand first power conductor structure 14A to one another, is arranged at an, in the illustration left-hand, edge of the first circuit carrier 10. A first, in the illustration lower, leg of the, in the illustration right-hand, U-shaped first power conductor structure 14B is arranged at an, in the illustration lower, edge of the first circuit carrier 10 and forms a second external contact region 14.2B of the right-hand first power conductor structure 14B. A wider second, in the illustration upper, leg of the right-hand first power conductor structure 14B forms at least one internal contact region 14.1, 14.1C, 14.D, at which at least one of the semiconductor switches 30 is contacted. A connecting piece of the right-hand first power conductor structure 14B, which connects the two legs of the right-hand first power conductor structure 14A to one another, is arranged at an, in the illustration right-hand, edge of the first circuit carrier 10. The two external contact regions 14.2A, 14.2B of the two first conductor structures 14A, 14B of the first circuit carrier 10 can each be contacted with a positive supply connection (not shown).

As can be further seen from FIGS. 4 to 6, the second power conductor structure 16 is designed to be T-shaped and rotated by 180°, so that a cross beam of the T-shaped second power conductor structure 16 is arranged between the two lower legs of the two first power conductor structure 14A, 14B at the, in the illustration lower, edge of the first circuit carrier 10. A longitudinal bar of the T-shaped second power conductor structure 16, which extends along the central longitudinal axis MA of the first circuit carrier 10, forms an internal contact region 16.1 of the second power conductor structure 16 at an, in the illustration upper, portion. In addition, an, in the illustration lower, portion of the cross beam of the second power conductor structure 16 forms the external contact region 16.2 of the second power conductor structure 16. The external contact region 16.2 of the second conductor structure 16 of the first circuit carrier 10 can be contacted with a negative supply connection (not shown).

As can be further seen from FIGS. 4 to 6, the third power conductor structure 18 is designed to be H-shaped and rotated by 90°, wherein an, in the illustration upper, longitudinal beam of the H-shaped third power conductor structure 18 is arranged on an, in the illustration upper, edge of the first circuit carrier 10. An, in the illustration lower and wider, longitudinal bar of the H-shaped third power conductor structure 18 is arranged between the connecting pieces of the two first power conductor structures 14A, 14B and is divided by the longitudinal bar of the T-shaped second power conductor structure 16 into an, in the illustration left-hand, portion which forms at least one internal contact region 18.1, 18.1A, 18.1B for at least one semiconductor switch 30, and an, in the illustration right-hand, portion which forms at least one internal contact region 18.1, 18.1C, 18.1D for at least one semiconductor switch 30. A connecting piece of the third power conductor structure 18, which connects the two longitudinal beams of the H-shaped third power conductor structure 18 to one another, runs along the central longitudinal axis MA of the first circuit carrier 10 between the upper legs of the two U-shaped first power conductor structures 14A, 14B and forms a further internal contact region 18.1E of the third power conductor structure 18. An, in the illustration upper, longitudinal beam of the H-shaped third power conductor structure 18 forms, in an, in the illustration left-hand, portion, a first external contact region 18.2A and in an, in the illustration right-hand, portion, a second external contact region 18.2B of the third power conductor structure 18. The two external contact regions 18.2A, 18.2B of the third conductor structure 18 of the first circuit carrier 10 can be contacted with a load connection.

In the illustrated exemplary embodiment of the power module 1, four semiconductor switches 30 each form a "high-side switch" HS1 to HS4 of the power module 1 and are arranged and electrically contacted with the power connections 32, 34 thereof between the at least one first conductor structure 14 of the first circuit carrier 10 and the at least one further power conductor structure 21 of a second circuit carrier 20A. In addition, four further semiconductor switches 30 each form a "low-side switch" LS1 to LS4 of the power module 1 and are electrically arranged and electrically contacted with the power connections 32, 34 thereof between the at least one second conductor structure 16 of the first circuit carrier 10 and the at least one further power conductor structure 21 of a further second circuit carrier 20B.

As can be further seen from FIGS. 2 to 6, in the illustrated exemplary embodiment of the power module 1, a first high-side switch HS1 is arranged and contacted with a first power connection 32 designed as a contact face on a first internal contact region 14.1A of the left-hand first power conductor structure 14A. A second high-side switch HS2 is arranged and contacted with a first power connection 32 designed as a contact face on a second internal contact region 14.1B of the left-hand first power conductor structure 14A. A third high-side switch HS3 is arranged and contacted with a first power connection 32 designed as a contact face on a third internal contact region 14.1C of the right-hand first power conductor structure 14B. A fourth high-side switch HS4 is arranged and contacted with a first power connection 32 designed as a contact face on a fourth internal contact region 14.1D of the right-hand first power conductor structure 14B. In addition, the high-side switches HS1, HS2 arranged and contacted on the left-hand first power conductor structure 14A form a first high-side switch group. The two high-side switches HS3, HS4 arranged on the opposite right-hand side of the first power conductor structure 14B form a second high-side switch group. In this case, the high-side switches HS3, HS4 arranged on the right-hand first power conductor structure 14B are aligned rotated by 180° with respect to the high-side switches HS1, HS2 arranged on the opposite left-hand first power conductor structure 14A, so that the second power connections 34 of the two high-side switches HS1, HS2 of the first high-side switch group face the second power connections 34 of the two high-side switches HS3, HS4 of the second high-side switch group.

As can be further seen from FIGS. 2 to 6, in the illustrated exemplary embodiment of the power module 1, a first low-side switch LS1 is arranged and contacted with a first power connection 32 designed as a contact face on a first internal contact region 18.1A of the left-hand portion of the third power conductor structure 18. A second low-side switch LS2 is arranged and contacted with a first power connection 32 designed as a contact face on a second internal contact region 18.1B of the left-hand portion of the third power conductor structure 18. A third low-side switch LS3 is arranged and contacted with a first power connection 32 designed as a contact face on a third internal contact region 18.1C of the right-hand portion of the third power conductor structure 18. A fourth low-side switch LS4 is arranged and contacted with a first power connection 32 designed as a contact face on a fourth internal contact region 18.1D of the right-hand portion of the first power conductor structure 18. In addition, the low-side switches LS1, LS2 arranged and contacted on the left-hand portion of the third power conductor structure 18 form a first low-side switch group. The two low-side switches LS3, LS4 arranged on the opposite right-hand portion of the third power conductor structure 14 form a second low-side switch group. In this case, the low-side switches LS3, LS4 arranged on the right-hand portion of the third power conductor structure 18 are aligned rotated by 180° with respect to the low-side switches LS1, HS2 arranged on the opposite left-hand portion of the third power conductor structure 18, so that the second power connections 34 of the two low-side switches LS1, LS2 of the first low-side switch group face the second power connections 34 of the two low-side switches HS3, HS4 of the second low-side switch group.

As can be further seen from FIGS. 2 to 6, in the illustrated exemplary embodiment of the power module 1, the second power connections 34 of the semiconductor switches 30, each designed as a contact face, are contacted via spacer elements 28A with internal contact regions 21.1 of the further power conductor structure 21 of the at least one second circuit carrier 20. As can be further seen from FIGS.

4 and 5, the second power connections 34 of the four high-side switches HS1 to HS4 are contacted with the further power conductor structure 21 of a second circuit carrier 20A and the four low-side switches LS1 to LS4 are contacted with the further power conductor structure 21 of a further second circuit carrier 20B.

As can be further seen from FIGS. 4 and 5, the second power connection 34 of the first high-side switch HS1 is contacted with a first internal contact region 21.1A of the further power conductor structure 21 of the second circuit carrier 20A. The second power connection 34 of the second high-side switch HS2 is in contact with a second internal contact region 21.1B of the further power conductor structure 21 of the second circuit carrier 20A. The second power connection 34 of the third high-side switch HS3 is in contact with a third internal contact region 21.1C of the further power conductor structure 21 of the second circuit carrier 20A. The second power connection 34 of the fourth high-side switch HS4 is in contact with a fourth internal contact region 21.1D of the further power conductor structure 21 of the second circuit carrier 20A. In addition, the further power conductor structure 21 of the second circuit carrier 20A is electrically connected to the internal contact region 18.1 of the third power conductor structure 18 of the first circuit carrier 10 at a fifth internal contact region 21.1E via a spacer element 28B.

As can be further seen from FIGS. 4 and 5, the second power connection 34 of the first low-side switch LS1 is in contact with a first internal contact region 21.1A of the further power conductor structure 21 of the further second circuit carrier 20B. The second power connection 34 of the second low-side switch LS2 is in contact with a second internal contact region 21.1B of the further power conductor structure 21 of the further second circuit carrier 20B. The second power connection 34 of the third low-side switch LS3 is in contact with a third internal contact region 21.1C of the further power conductor structure 21 of the further second circuit carrier 20B. The second power connection 34 of the fourth low-side switch LS4 is in contact with a fourth internal contact region 21.1D of the further power conductor structure 21 of the further second circuit carrier 20B. In addition, the further power conductor structure 21 of the further second circuit carrier 20A is electrically connected to the internal contact region 16.1 of the second power conductor structure 16 of the first circuit carrier 10 at a fifth internal contact region 21.1E via a spacer element 28B.

As can be further seen from FIGS. 2 to 4, a common conductor structure 22 and a plurality of control signal conductor structures 23 are arranged on the electrically insulating layer 20.1 as part of the signal level SE on the second side of the at least one second circuit carrier 20. In this case, the control connections of the semiconductor switches 30, which are designed as Kelvin source connections 38, are each electrically connected to internal contact regions 22.1 of the common conductor structure 22 of the at least one second circuit carrier 20 via connecting lines 19 designed as bonding wires 19A. In addition, the common conductor structure 22 of the at least one second circuit carrier 20A has two external contact regions 22.2 which can be contacted with an external control circuit (not shown in detail). The control signal conductor structures 23 of the at least one second circuit carrier 20 are each connected at an internal contact region 23.1 via connecting lines 29, designed as bonding wires 29A, to a control connection of one of the semiconductor switches 30, designed as a gate connection 36. In addition, the control signal conductor structures 23 of the at least one second circuit carrier 20 each have an external contact region 23.2 which can be contacted with the external control circuit (not shown in more detail).

As can be further seen from FIG. 4, the Kelvin source connection 38 of the first high-side switch HS1 is connected to a first internal contact region 22.1A of the common conductor structure 22 of the second circuit carrier 20A. The gate connection 36 of the first high-side switch HS1 is electrically contacted with a first internal contact region 21.1A of a first control signal conductor structure 23A of the second circuit carrier 20A, which structure has a first external contact region 23.2A. The Kelvin source connection 38 of the second high-side switch HS2 is connected to a second internal contact region 22.1B of the common conductor structure 22 of the second circuit carrier 20A. The gate connection 36 of the second high-side switch HS2 is electrically contacted with a second internal contact region 21.1B of a second control signal conductor structure 23B of the second circuit carrier 20B, which has a second external contact region 23.2B. The Kelvin source connection 38 of the third high-side switch HS3 is connected to a third internal contact region 22.1C of the common conductor structure 22 of the second circuit carrier 20A. The gate connection 36 of the third high-side switch HS3 is electrically contacted with a third internal contact region 21.1C of a third control signal conductor structure 23C of the second circuit carrier 20A, which has a third external contact region 23.2C. The Kelvin source connection 38 of the fourth high-side switch HS4 is connected to a fourth internal contact region 22.1D of the common conductor structure 22 of the second circuit carrier 20A. The gate connection 36 of the fourth high-side switch HS4 is electrically contacted with a fourth internal contact region 21.1D of a fourth control signal conductor structure 23D of the second circuit carrier 20A, which has a fourth external contact region 23.2D. As can be further seen from FIG. 4, a first external contact region 22.2A of the common conductor structure 22 is arranged between the first internal contact region 22.1A and the third internal contact region 22.1C of the common conductor structure 22. A second external contact region 22.2B of the common conductor structure 22 is arranged between the second internal contact region 22.1B and the fourth internal contact region 22.1D of the common conductor structure 22.

As can be further seen from FIG. 4, the Kelvin source connection 38 of the first low-side switch LS1 is connected to a first internal contact region 22.1A of the common conductor structure 22 of the further second circuit carrier 20B. The gate connection 36 of the first low-side switch LS1 is electrically contacted with a first internal contact region 21.1A of a first control signal conductor structure 23A of the further second circuit carrier 20B, which structure has a first external contact region 23.2A. The Kelvin source connection 38 of the second low-side switch LS2 is connected to a second internal contact region 22.1B of the common conductor structure 22 of the further second circuit carrier 20B. The gate connection 36 of the second low-side switch HS2 is electrically contacted with a second internal contact region 21.1B of a second control signal conductor structure 23B of the second circuit carrier 20B, which structure has a second external contact region 23.2B. The Kelvin source connection 38 of the third low-side switch LS3 is connected to a third internal contact region 22.1C of the common conductor structure 22 of the further second circuit carrier 20B. The gate connection 36 of the third low-side switch LS3 is electrically contacted with a third internal contact region 21.1C of a third control signal conductor structure 23C of the further second circuit carrier 20B, which structure has a third external contact region 23.2C. The Kelvin source connection 38 of the fourth low-side switch LS4 is connected to a fourth internal contact region 22.1D of the common conductor structure 22 of the further second circuit carrier 20B. The gate connection 36 of the fourth low-side switch LS4 is electrically contacted with a fourth internal contact region 21.1D of a fourth control signal conductor structure 23D of the further second circuit carrier 20A, which has a fourth external contact region 23.2D. As can be further seen from FIG. 4, a first external contact region 22.2A of the common conductor structure 22 is arranged between the first internal contact region 22.1A and the third internal contact region 22.1C of the common conductor structure 22. A second external contact region 22.2B of the common conductor structure 22 is arranged between the second internal contact region 22.1B and the fourth internal contact region 22.1D of the common conductor structure 22.

In addition, at least one measuring signal conductor structure 24 is arranged on the electrically insulating layer 20.1 as part of the signal level SE on the second side of the at least one second circuit carrier 20. As can be further seen in particular from FIG. 4, in the illustrated exemplary embodiment of the power module 1, an internal contact region 24.1 of a first measuring signal conductor structure 24A of the second circuit carrier 20A is electrically connected to the left-hand first power conductor structure 14A of the first circuit carrier 10 via a connecting line 19 designed as a bonding wire 19A. An external contact region 24.2 of the first measurement signal structure 24A of the second circuit carrier 20A provides a power measurement point MPL via a spacer element 27. An internal contact region 24.1 of a second measuring signal conductor structure 24B of the second circuit carrier 20A is electrically connected to a first connection of a temperature sensor TS, the second connection of which is electrically connected to a fifth internal contact region 22.1E of the common conductor structure 22 of the second circuit carrier 20A. An external contact region 24.2 of the second measurement signal structure 24B provides a temperature measurement signal. Similarly, an internal contact region 24.1 of a first measuring signal conductor structure 24A of the further second circuit carrier 20B is electrically connected to the left-hand portion of the third power conductor structure 18 of the first circuit carrier 10 via a connecting line 19 designed as a bonding wire 19A. An external contact region 24.2 of the first measurement signal structure 24A of the further second circuit carrier 20A provides a further power measurement point MPL via a spacer element 27. An internal contact region 24.1 of a second measuring signal conductor structure 24B of the further second circuit carrier 20B is electrically connected to a first connection of a temperature sensor TS, the second connection of which is electrically connected to a fifth internal contact region 22.1E of the common conductor structure 22 of the further second circuit carrier 20B. An external contact region 24.2 of the second measurement signal structure 24B provides a temperature measurement signal.

As can be further seen from FIG. 4, the second circuit carrier 20A is placed in such a way that a first electrically symmetrical current star point SPS of the signal level SE, which corresponds to a geometric center of the common conductor structure 22 of the second circuit carrier 20A, overlaps at least partially with a spacer element 28B, which forms a second electrically symmetrical current star point SPL of the first and second power level LE1, LE2 and electrically connects the fifth internal contact region 21.1E of the further power conductor structure 21 of the second circuit carrier 20A to the internal contact region 18.1 of the third power conductor structure 18 of the first circuit carrier 10. The further second circuit carrier 20B is placed in such a way that a first electrically symmetrical current star point SPS of the signal level SE, which corresponds to a geometric center of the common conductor structure 22 of the further second circuit carrier 20B, overlaps at least partially with a spacer element 28B which forms a second electrically symmetrical current star point SPL of the first and second power level LE1, LE2 and electrically connects the fifth internal contact region 21.1E of the further power conductor structure 21 of the further second circuit carrier 20B to the internal contact region 16.1 of the second power conductor structure 16 of the first circuit carrier 10.

The invention claimed is:

1. A power module, comprising:

a first circuit carrier; and at least one second circuit carrier, wherein the first circuit carrier has a plurality of power conductor structures arranged on an electrically insulating layer on a first side, the power conductor structures of the first circuit carrier forming a first power level in which external contact regions of the power conductor structures are arranged, wherein the at least one second circuit carrier is arranged spatially in parallel with the first circuit carrier, and has at least one further power conductor structure arranged on an electrically insulating layer on a first side facing the first side of the first circuit carrier, the at least one further power conductor structure of the at least one second circuit carrier forming a second power level, wherein the at least one further power conductor structure of the at least one second circuit carrier is electrically connected at an internal contact region to an internal contact region of one of the power conductor structures of the first circuit carrier, wherein at least one control signal conductor structure is arranged on the electrically insulating layer on a second side of the at least one second circuit carrier, and forms a signal level, wherein at least two semiconductor switches are arranged and electrically contacted with power connections of the at least two semiconductor switches between the conductor structures of the first power level of the first circuit carrier and the at least one further power conductor structure of the second power level of the at least one second circuit carrier, wherein control connections of the at least two semiconductor switches are electrically connected to the at least one control signal conductor structure of the at least one second circuit carrier.

2. The power module according to claim 1, wherein the first circuit carrier has at least one thermal interface on a second side, wherein the thermal interface can be contacted with a cooling device.

3. The power module according to claim 2, wherein an encasement completely encloses the power module with the at least one thermal interface being left exposed, the encasement having at least one recess in a region of external contact regions of the first circuit carrier and in a region of external contact regions of the at least one second circuit carrier.

4. The power module according to claim 1, wherein a common conductor structure is arranged on the electrically insulating layer as part of the signal level on the second side of the at least one second circuit carrier, control connections of the at least two semiconductor switches configured as Kelvin source connections being electrically connected to the common conductor structure.

5. The power module according to claim 4, wherein the at least one second circuit carrier is placed in such a way that a first electrically symmetrical current star point of the signal level, which corresponds to a geometric center of the common conductor structure, overlaps at least partially with a spacer element which forms a second electrically symmetrical current star point of the first and second power levels and electrically connects the internal contact region of the at least one further power conductor structure of the at least one second circuit carrier to the internal contact region of one of the power conductor structures of the first circuit carrier.

6. The power module according to claim 1, wherein, on the second side of the at least one second circuit carrier, at least one measuring signal conductor structure is arranged on the electrically insulating layer as part of the signal level.

7. The power module according to claim 6, wherein an internal contact region of a first measuring signal conductor structure of the at least one second circuit carrier is electrically connected to one of the power conductor structures of the first circuit carrier via a connection line, an external contact region of the first measurement signal structure of the at least one second circuit carrier providing a power measurement point via a spacer element.

8. The power module according to claim 7, wherein an internal contact region of a second measuring signal conductor structure of the at least one second circuit carrier is electrically connected to a first connection of a temperature sensor, a second connection of the temperature sensor being electrically connected to an internal contact region of the common conductor structure of the at least one second circuit carrier, an external contact region of the second measurement signal structure providing a temperature measurement signal.

9. The power module according to claim 1, wherein at least one first power conductor structure of the power conductor structures of the first circuit carrier can be contacted via at least one external contact region with a positive supply connection, and at least one second power conductor structure of the power conductors of the first circuit carrier can be contacted via at least one external contact region with a negative supply connection, and at least one third power conductor structure of the power conductor structures of the first circuit carrier can be contacted via at least one external contact region with a load connection.

10. The power module according to claim 9, wherein each of the at least two semiconductor switches forms a "high-side switch" of the power module and are arranged and electrically contacted with the power connections thereof between the at least one first power conductor structure of the first circuit carrier and the at least one further power conductor structure of the second circuit carrier, control connections of the high-side switches configured as gate connections each being electrically connected to the control signal conductor structure of the second circuit carrier the at least one further power conductor structure of the second circuit carrier being electrically connected at the internal contact region to the internal contact region of the third power conductor structure of the first circuit carrier.

11. The power module according to claim 9, wherein, the at least two semiconductor switches each forms a "low-side switch" of the power module and are electrically arranged and electrically contacted with the power connections thereof between the at least one second conductor structure of the first circuit carrier and at least one further power conductor structure of a further second circuit carrier, control connections of the low-side switches configured as gate connections each being electrically connected to a control signal conductor structure of the further second circuit carrier, the at least one further power conductor structure of the further second circuit carrier being electrically connected at an internal contact region to the internal contact region of the second power conductor structure of the first circuit carrier.

12. The power module according to claim 1, wherein the first circuit carrier and/or the at least one second circuit carrier is an active metal braze (AMB) substrate or a direct bonded copper (DBC) substrate.

* * * * *